United States Patent
Shrivastava

(10) Patent No.: US 11,901,282 B2
(45) Date of Patent: Feb. 13, 2024

(54) DEVICE ISOLATORS

(71) Applicant: TEXAS INSTRUMENTS INCORPORATED, Dallas, TX (US)

(72) Inventor: Kumar Anurag Shrivastava, Bengaluru (IN)

(73) Assignee: Texas Instruments Incorporated, Dallas, TX (US)

( * ) Notice: Subject to any disclaimer, the term of this patent is extended or adjusted under 35 U.S.C. 154(b) by 284 days.

(21) Appl. No.: 16/585,393

(22) Filed: Sep. 27, 2019

(65) Prior Publication Data

US 2020/0335436 A1 Oct. 22, 2020

(30) Foreign Application Priority Data

Apr. 20, 2019 (IN) .............................. 201941015751

(51) Int. Cl.
  *H01L 23/522* (2006.01)
  *H01L 23/528* (2006.01)
  *H01L 23/00* (2006.01)
  *H01L 49/02* (2006.01)

(52) U.S. Cl.
  CPC ...... *H01L 23/5223* (2013.01); *H01L 23/5286* (2013.01); *H01L 24/05* (2013.01); *H01L 24/48* (2013.01); *H01L 28/60* (2013.01); *H01L 2224/04042* (2013.01); *H01L 2224/48137* (2013.01)

(58) Field of Classification Search
  CPC .......... H01L 23/5223; H01L 23/522–23/5228; H01L 24/40–24/49; H01L 23/528–23/5286; H01L 28/60; H01L 28/65; H01L 24/05; H01L 2224/04042; H01L 27/0676; H01L 27/0716; H01L 27/0755; H01L 27/0777; H01L 27/0788; H01L 27/0794; H01L 27/0805; H01L 28/40; H01L 23/5222; H01L 23/5225; H01L 23/5226; H01L 24/48; H01L 2224/48137
  See application file for complete search history.

(56) References Cited

U.S. PATENT DOCUMENTS

| | | | | |
|---|---|---|---|---|
| 8,890,223 | B1* | 11/2014 | Bonifield | H01L 23/5222 |
| | | | | 257/296 |
| 9,087,853 | B2* | 7/2015 | Tao | H01L 28/60 |
| 9,768,245 | B2* | 9/2017 | West | H01L 29/0692 |
| 9,812,389 | B2* | 11/2017 | Ho | H01L 23/528 |
| 10,211,281 | B2* | 2/2019 | Tao | H01L 23/481 |
| 10,418,320 | B2* | 9/2019 | West | H01L 23/5223 |
| 10,679,935 | B2* | 6/2020 | West | H01L 21/0217 |
| 10,692,786 | B1* | 6/2020 | Lin | H01L 23/055 |
| 2007/0075397 | A1* | 4/2007 | Zhang | H01L 28/40 |
| | | | | 257/E29.345 |
| 2015/0115407 | A1* | 4/2015 | Tao | H01L 29/0623 |
| | | | | 257/532 |
| 2015/0214292 | A1* | 7/2015 | Tao | H01L 29/94 |
| | | | | 307/109 |
| 2016/0126324 | A1* | 5/2016 | Yu | H01L 29/402 |
| | | | | 257/503 |
| 2017/0098604 | A1* | 4/2017 | Ho | H01L 23/5223 |

(Continued)

*Primary Examiner* — Latanya N Crawford Eason

(74) *Attorney, Agent, or Firm* — Valerie M. Davis; Frank D. Cimino

(57) ABSTRACT

An integrated semiconductor device having a metallic element formed between a capacitor with and a doped region.

20 Claims, 7 Drawing Sheets

(56) References Cited

U.S. PATENT DOCUMENTS

| | | | |
|---|---|---|---|
| 2017/0149404 A1* | 5/2017 | Tsai | H01L 23/5225 |
| 2018/0068946 A1* | 3/2018 | Ho | H01L 27/0288 |
| 2020/0058580 A1* | 2/2020 | Lin | H01L 23/528 |
| 2021/0074631 A1* | 3/2021 | Takizawa | H01L 23/5223 |

\* cited by examiner

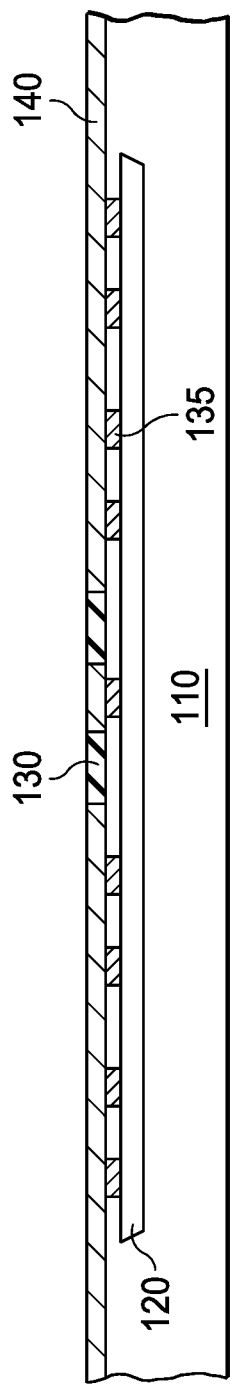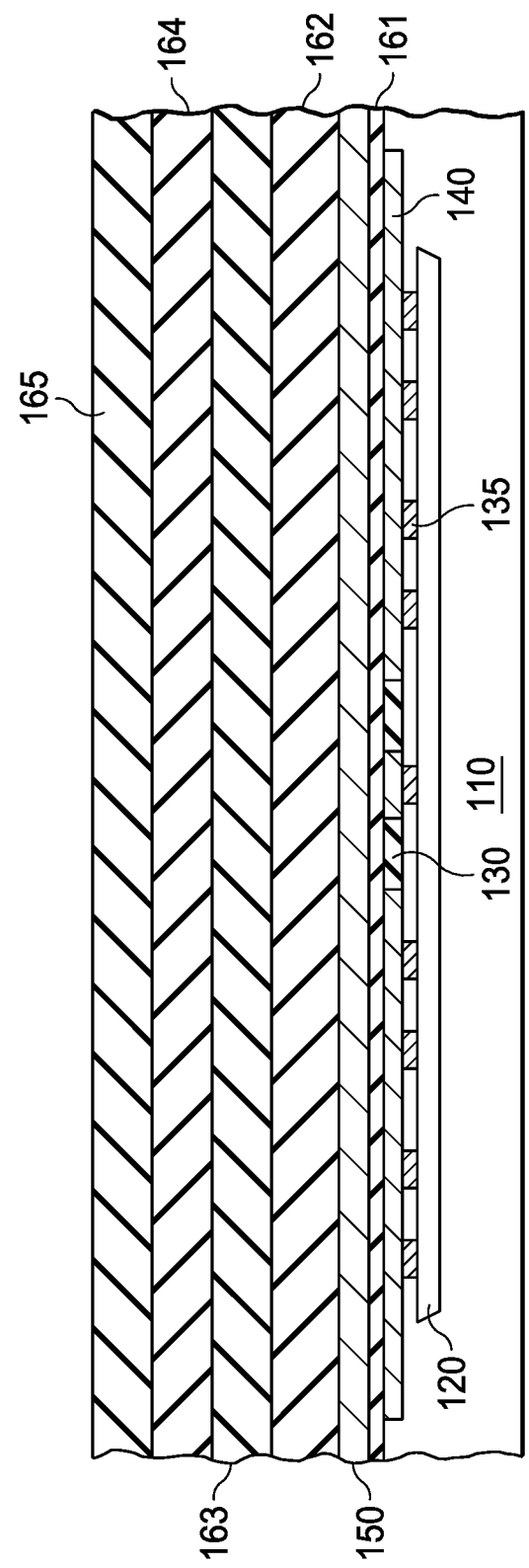

DEVICE ISOLATORS

RELATED APPLICATION

This application claims the benefit of Indian Provisional Application No. 201941015751, filed on Apr. 20, 2019. The entire content of that application is hereby incorporated by reference.

BACKGROUND OF THE INVENTION AND RELATED ART

Aspects of the disclosure relate generally to device isolators. Conventional isolators are used to in many devices to isolate functional sections of electrical systems in order to prevent current flow between them but allow data to pass between two devices. This is typically done by capacitors having a top electrode 10 and a bottom electrode 20 formed over a substrate 30 having a doped region 40 as shown in FIG. 1 (a cross-sectional view of a flat bottom electrode within or over a doped well in a semiconductor substrate).

One of the drawbacks to the conventional isolator is that the path for any current within the doped region of the substrate to a node (such as a ground) is variable and can take any path along its surface as shown in FIG. 2. This can result in parasitic capacitance, which lowers the quality factor (or Q) of the isolator. As such, an improved isolator is desired.

SUMMARY

An aspect of the present disclosure relates to an integrated device having an isolator having a substrate with a doped region and first, second, and third metallic elements formed over the substrate. An additional aspect of the present disclosure relates to an improved device isolator having a ten-fold quality factor (Q) than conventional device isolators.

BRIEF DESCRIPTION OF THE DRAWINGS

For a detailed description of various examples, reference will now be made to the accompanying drawings in which:

FIGS. 7-12 illustrate an exemplary method of forming embodiments in accordance with the present disclosure.

DETAILED DESCRIPTION

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to." Also, the term "couple" or "couples" is intended to mean either an indirect or direct wired or wireless connection. Thus, if a first device couples to a second device, that connection may be through a direct connection or through an indirect connection via other devices and connections.

Figure 3:
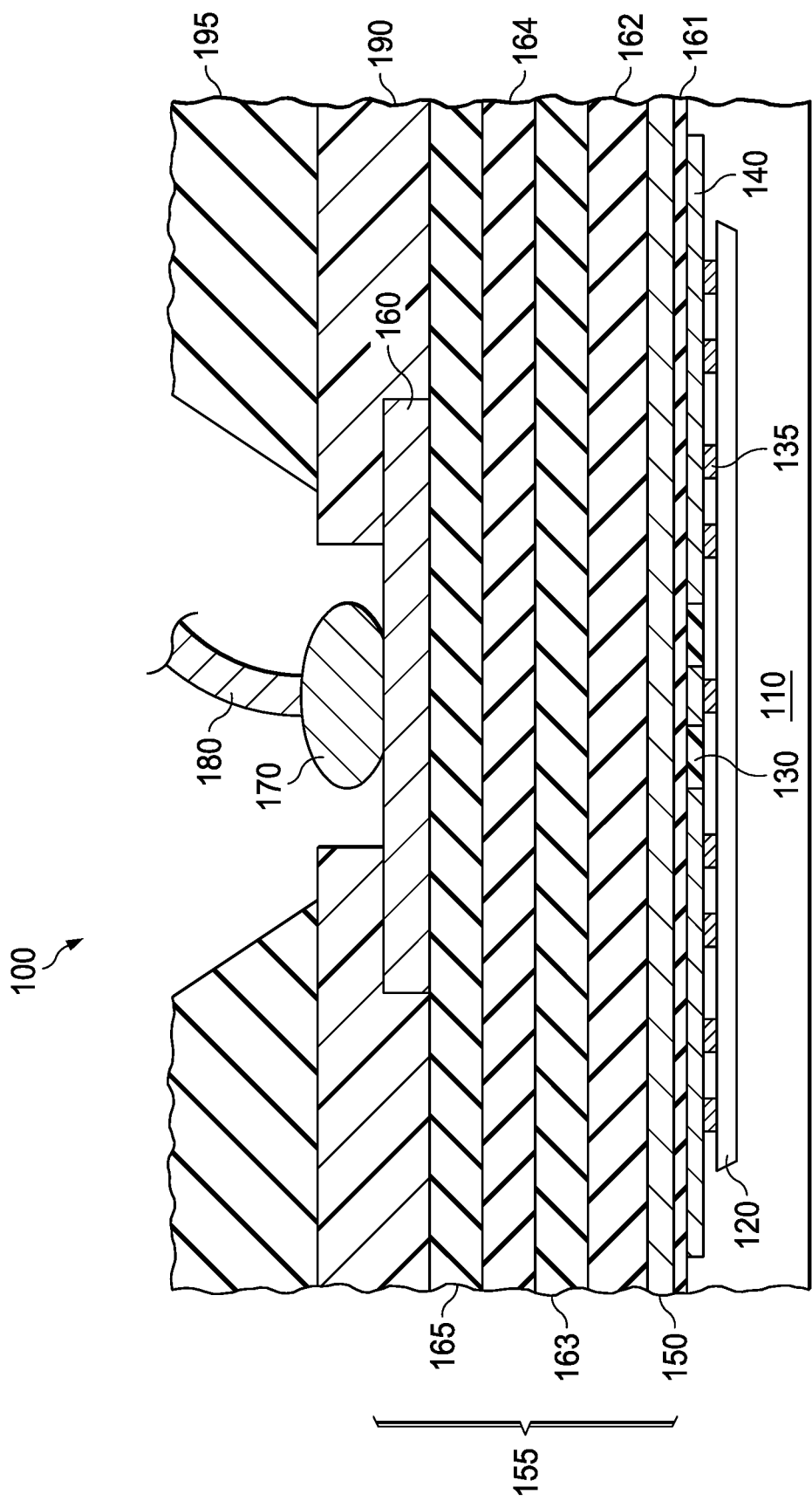
FIG. 3 illustrates a partial cross-sectional view of a device isolator in accordance with an embodiment of the present disclosure.

Aspects of the disclosure relate generally to integrated semiconductor devices having device isolators. As illustrated in FIG. 3, which is a cross-sectional view of a portion of an isolator device 100 in accordance with the present disclosure, a substrate 110 having a doped region 120 formed therein has a series of contacts 135 coupling a plurality of first metallic elements 140 formed over the substrate 110 to the doped region 120. The first metallic elements 140 are connected to a node (not shown). The node could be a ground. The first metallic elements 140 are separated from one another by an oxide layer 130. The first metallic elements 140 comprise a non-continuous metallic layer separated by the oxide layer 130 that may serve as a ground for any current in the doped region 120. The isolator device 100 also includes a second metallic element 150 that forms a bottom electrode of a capacitor 155 and a third metallic element 160 that forms the top electrode of the capacitor 155. The capacitor 155 is formed above the first metallic elements 140. Also shown are multiple inter-layer dielectric elements (first inter-layer dielectric element 161, second inter-layer dielectric element 162, third inter-layer dielectric element 163, fourth inter-layer dielectric element 164, and fifth inter-layer dielectric element 165). Any one of the inter-layer dielectric elements could be formed of an oxide material. The isolator device 100 also includes a wire bond 170 that is coupled to a wire 180. Also included are a protective overcoat 190 and a top inter-layer dielectric element 195.

Figure 1:
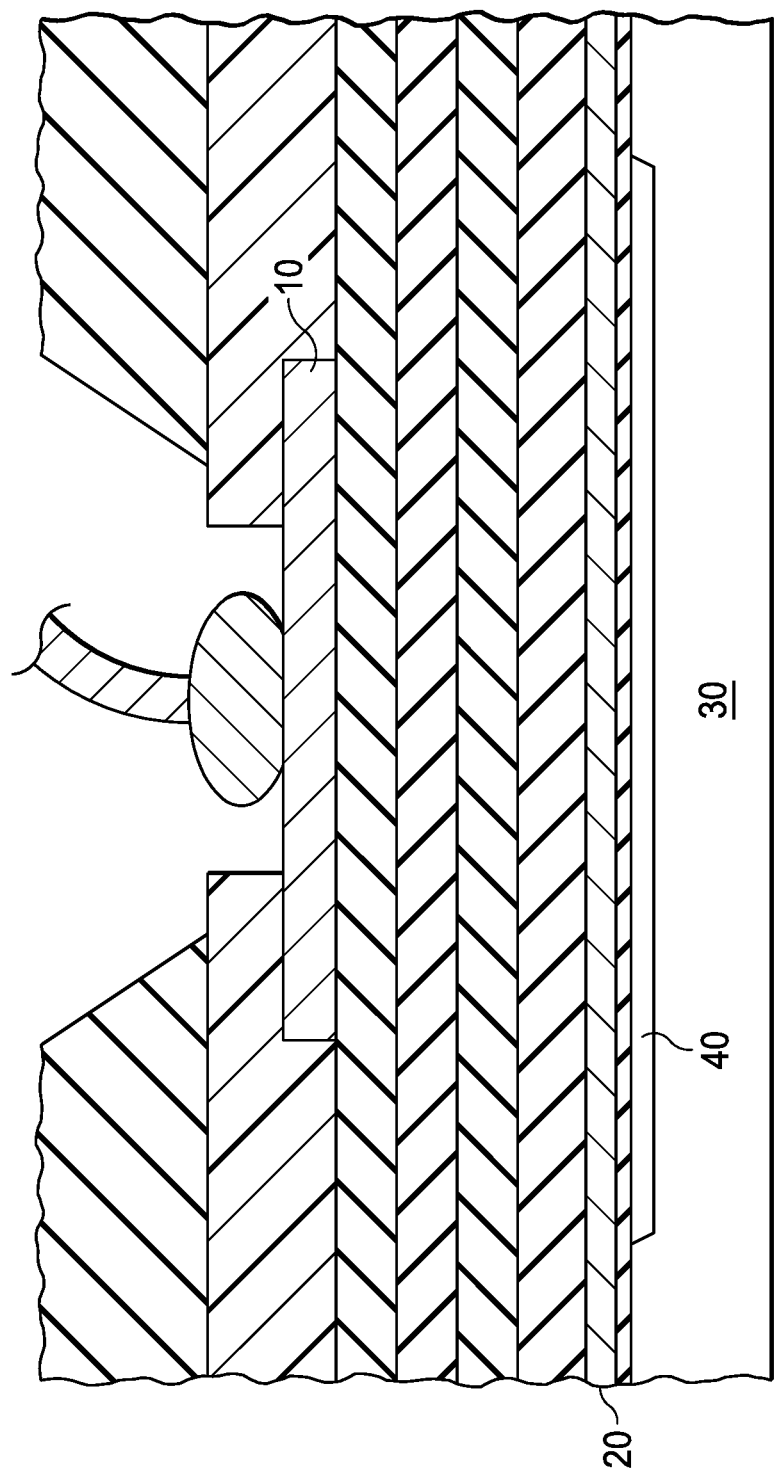
FIG. 1 illustrates a portion of a conventional isolator.
Figure 2:
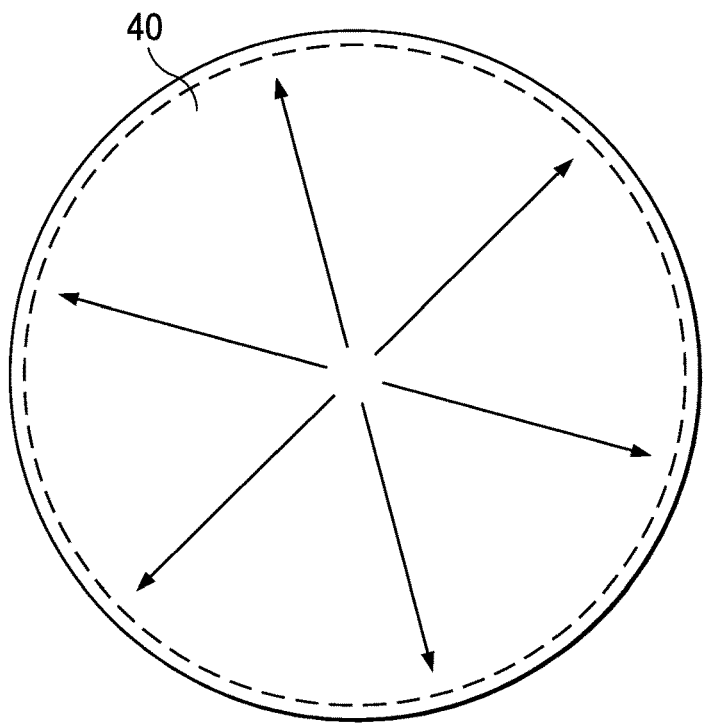
FIG. 2 illustrates a top-down view of a conventional flat bottom electrode formed either within or over a doped well in a semiconductor substrate.
Figure 4:
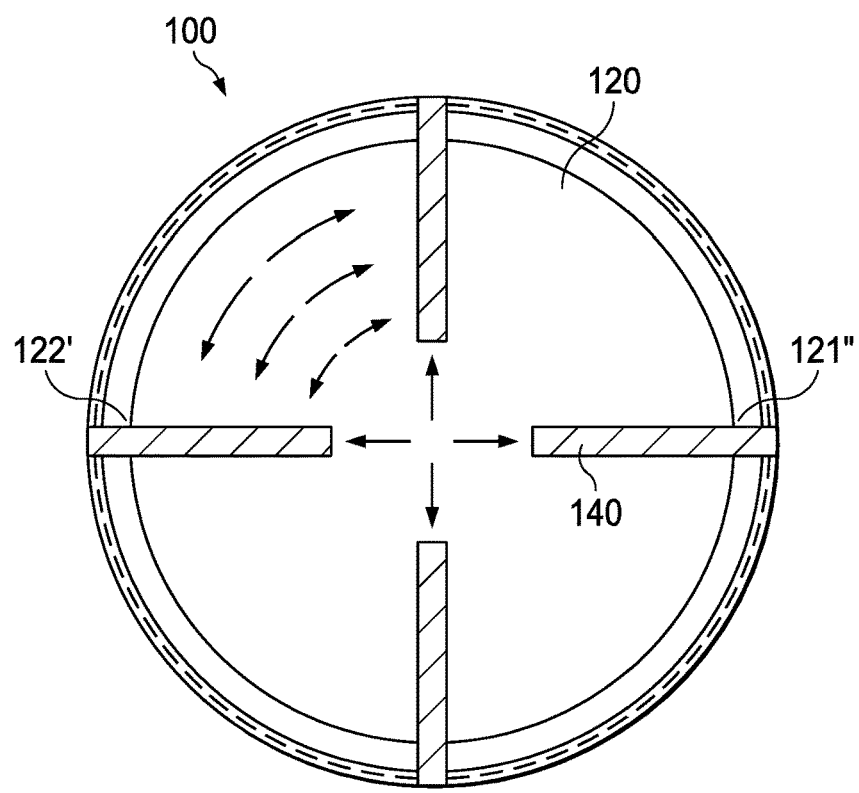
FIG. 4 illustrates a partial top-down view of a second metallic element in accordance with an embodiment of the present disclosure.

As shown in FIG. 4, the first metallic elements 140 provide a shorter pathway (as indicated by the arrows) for any current in the doped region 120 of the substrate 110 to travel. As illustrated, the first metallic elements 140 are formed as metallic strips that extend outwardly from a center of the doped region 120. Because the current is drawn away by shorter paths, the first metallic elements 140 are able to dissipate any parasitic resistivity quicker, which results in improved quality factor (Q) of nearly ten-fold as compared with conventional device isolators like the one shown in FIG. 1. It should be noted that the example with four first metallic elements 140 is not intended to be limiting. For example, the isolator device 100 could have one first metallic element 140 formed as a strip that extends from a first edge of the doped region 120' to a second edge of the doped region 120'' or could have less than four or greater than four first metallic elements 140. The number of first metallic elements 140 depends on its intended application.

Figure 5:
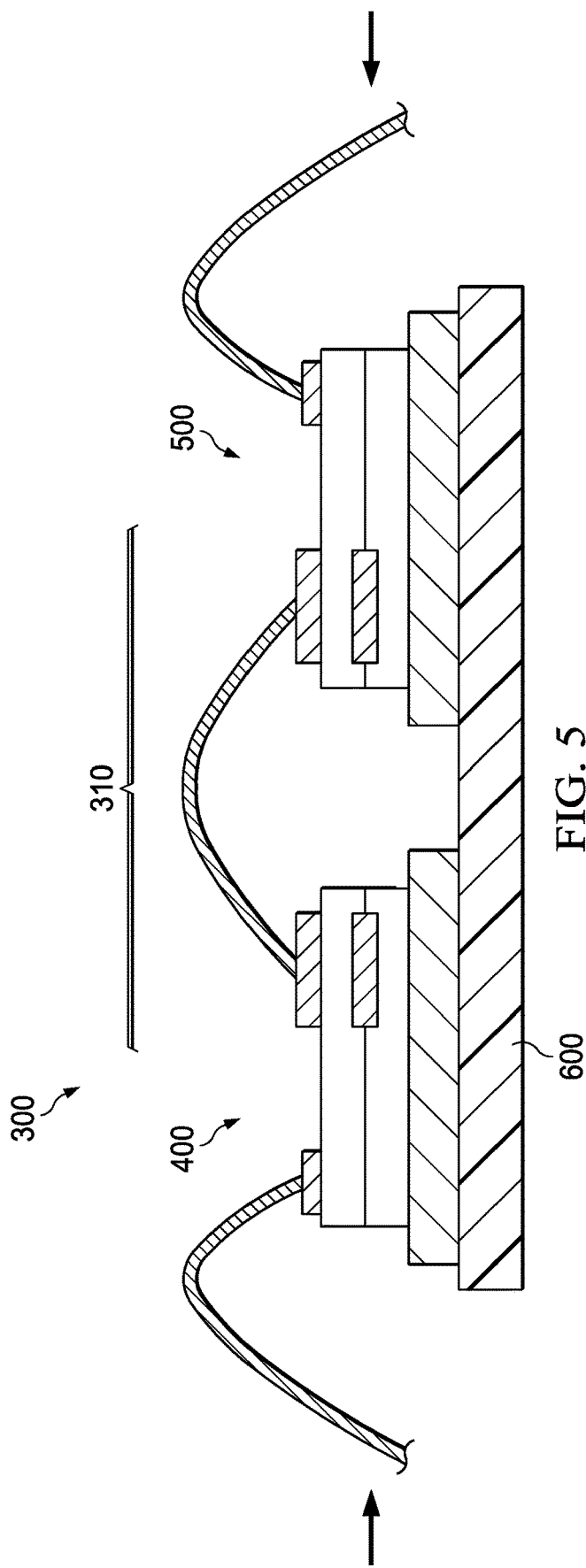
FIG. 5 illustrates an integrated semiconductor device having a device isolator in accordance with an embodiment of the present disclosure.
Figure 6:
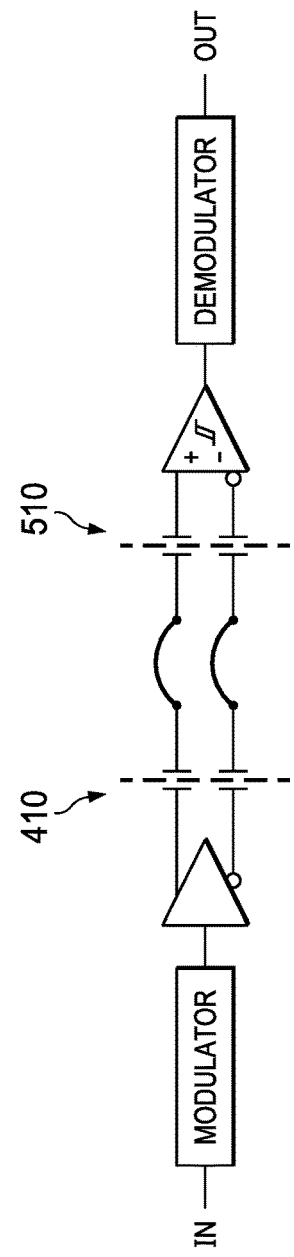
FIG. 6 illustrates a schematic of an integrated semiconductor device having a device isolator in accordance with an embodiment of the present disclosure.

An integrated circuit device 300 incorporating the FIG. 3 structure is illustrated in FIG. 5. As illustrated, a device isolator 310 can be used for communication from a first device 400 to a second device 500. The two devices are optionally on or in a single package 600. The example is not, however, intended to be limiting to such an arrangement. For example, the two devices may be on separate packages. The isolation is realized by using capacitors combined in series (FIG. 6). Each channel uses high-voltage isolation capacitors on both first device 400 and second device 500. As shown in the schematic cross-section in FIG. 6, the high-voltage pair of capacitors 410 and 510 are connected in series. The combined isolation capacitor thickness can vary, and typically should be greater than 21 microns. As shown in FIG. 6, data is transmitted across the isolation barrier. Signal comes in, is modulated, goes across the barrier as part of a differential pair of capacitors (410 and 510), demodulated, and out. This same isolation communication path is used for digital isolators, for isolated links, for A to D converters, isolated amplifiers, isolated gate drivers, and other integrated semiconductor devices.

It should also be noted that the integrated circuit 300 of FIGS. 5 and 6 should have at least one device having first metallic elements 140 formed between the doped region 120 and a capacitor 155. But, depending on the intended application, not every device requires first metallic elements 140 formed between the doped region 120 and a capacitor 155.

Figure 7:
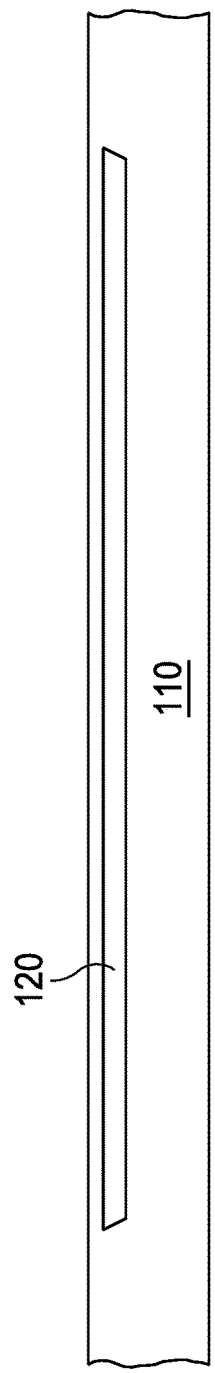
Figure 8:
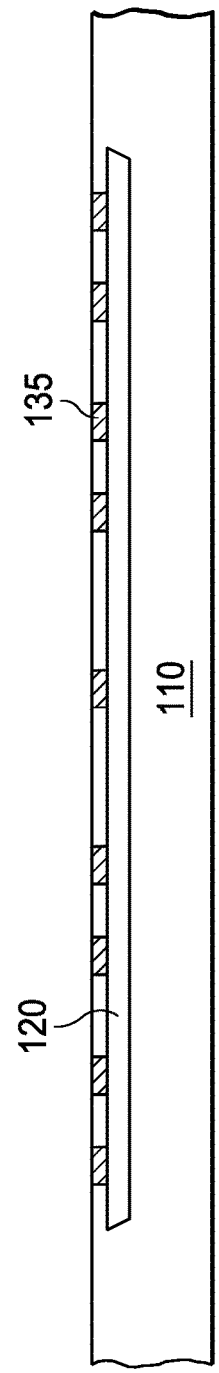

FIGS. 7-12 illustrate an explary embodiment of a method of forming a device isolator in accordance with the present disclosure. FIG. 7 illustrates a substrate 110 having a doped region 120 formed therein. Typically, the doped region 120 is a shallow n-type well (or SWELL). However, the doped region could be an n-type or s-type region depending on the application. FIG. 8 illustrates a plurality of contacts 135 formed over the doped region 120. This can be accomplished by selectively etching portions of the substrate and depositing the etched portions with a metallic material.

Figure 9:
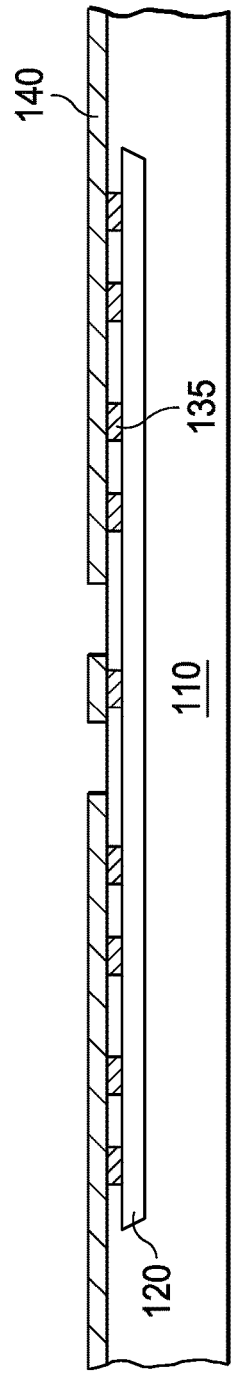

FIG. 9 illustrates the formation of the first metallic elements 140 over the doped region 120. The first metallic elements 140 can be formed by depositing a metallic precursor layer over the substrate 110 and plurality of contacts 135, and selectively removing portions of the metallic precursor layer to form the first metallic elements 140. The removal process can be performed by selectively etching portions of the metallic layer with or without the use of a mask.

Figure 12:
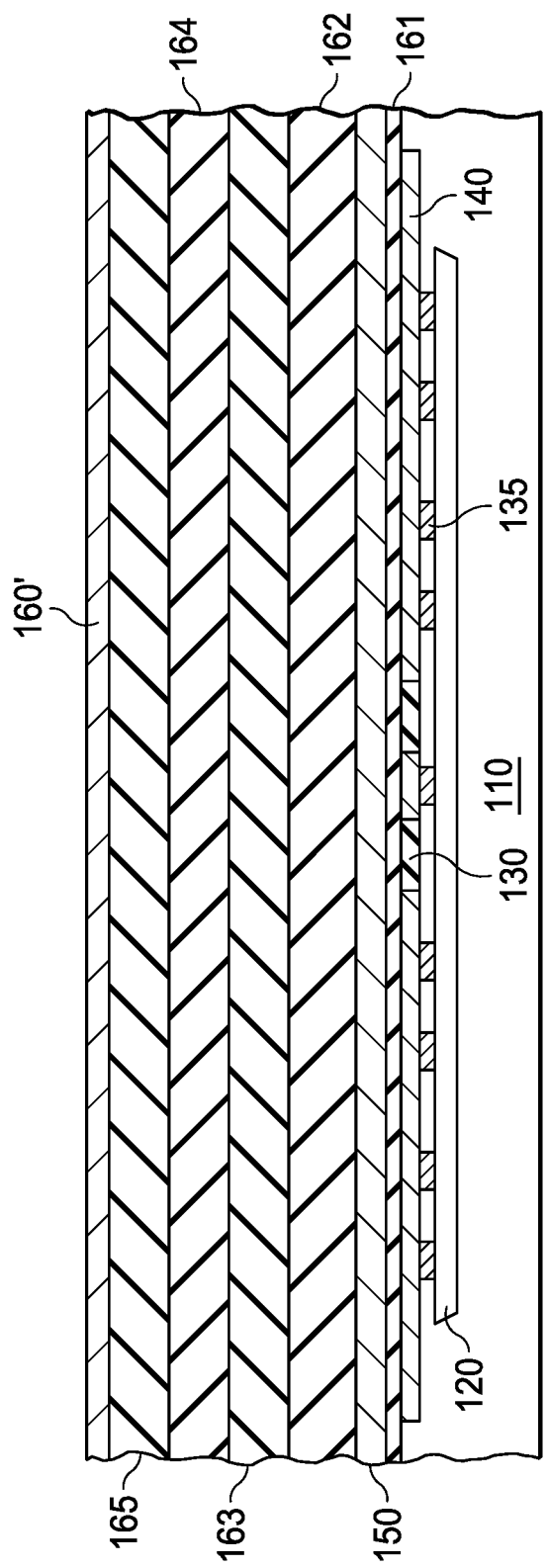

FIG. 10 shows an oxide layer 130 formed to planarize the structure, and to separate the first metallic elements. The additional layers, including the second metallic element 150 and the inter-layer dielectric layers 161, 162, 163, 164, and 165, that forms the bottom electrode of a capacitor 155 (FIG. 3.), are added to form the structure illustrated in FIG. 11. FIG. 12 shows a third metallic element precursor 160' formed over the FIG. 11 structure. The third metallic element precursor 160' is selectively removed to form the third metallic element 160 (FIG. 3), which forms the top electrode of capacitor 155 (FIG. 3). A protective overcoat 190 is formed over portions of the exposed inter-layer dielectric element 165 and selectively removed to expose a portion of the third metallic element 160 to which a wire bond 170 is formed (FIG. 3). A wire 180 is attached to the wire bond 170.

The above discussion is meant to be illustrative of the principles and various embodiments of the present invention. Numerous variations and modifications will become apparent to those skilled in the art once the above disclosure is fully appreciated. For example, while the cross-sectional thicknesses of the various layers have been illustrated relative to one another in FIGS. 3-12, they are not intended to be limiting. Different relative thicknesses can be used. Accordingly, it is intended that the following claims be interpreted to embrace all such variations and modifications.

What is claimed is:

1. An integrated circuit, comprising:
   a substrate;
   a doped region within the substrate;
   first and second metallic elements over the doped region, the first and second metallic elements separated by an oxide region;
   a first metallic contact within the substrate and coupled directly between the first metallic element and the doped region, and a second metallic contact within the substrate and coupled directly between the second metallic element and the doped region; and
   a capacitor comprising:
      a third metallic element over the first and second metallic elements, and
      a fourth metallic element over the third metallic element.

2. The integrated circuit of claim 1, wherein the first metallic contact is configured to form a current path between the doped region and the first metallic element to draw current away from the doped region.

3. The integrated circuit of claim 2, wherein the second metallic contact is configured to form a current path between the doped region and the second metallic element to draw current away from the doped region.

4. The integrated circuit of claim 1, wherein the oxide region functions as a ground for current in the doped region.

5. The integrated circuit of claim 1, wherein the capacitor is a first capacitor, and the integrated circuit further comprising a second capacitor coupled to the first capacitor.

6. The integrated circuit of claim 1, wherein the first and second metallic elements are within the substrate.

7. An integrated circuit package having a plurality of semiconductor devices, at least one semiconductor device comprising:
   a substrate;
   a doped region within the substrate;
   first and second metallic elements over the doped region, the first and second metallic elements separated by an oxide layer:
      first and second metallic contacts within the substrate, the first metallic contact coupled directly between the first metallic element and the doped region, and the second metallic contact coupled directly between the second metallic element and the doped region; and
   a capacitor comprising:
      a bottom electrode over the first and second metallic elements, and
      a top electrode over the bottom electrode.

8. The integrated circuit of claim 7, wherein the first and second metallic elements are coupled to a ground.

9. The integrated circuit of claim 7, wherein the first and second metallic elements each extends outwardly from a center area of the doped region.

10. The integrated circuit of claim 7, wherein the first metallic contact is configured to form a current path between the doped region and the first metallic element to draw current away from the doped region, and the second metallic contact is configured to form a current path between the doped region and the second metallic element to draw current away from the doped region.

11. The integrated circuit of claim 7, wherein the first and second metallic elements are within the substrate.

12. An integrated circuit package having at least two semiconductor devices, each of the semiconductor devices comprising:
   a substrate;
   a doped region within the substrate;

first and second metallic elements over the doped region, the first and second metallic elements separated by an oxide region;

first metallic contacts within the substrate and spaced apart and each having opposite sides and second metallic contacts within the substrate and spaced apart and each having opposite sides, the first metallic contacts contacting the first metallic element on one side and contacting the doped region on the other side, the second metallic contacts contacting the second metallic element on one side and contacting the doped region on the other side; and a capacitor comprising:
   a first electrode over the first and second metallic elements, and
   a second electrode over the first electrode.

13. The integrated circuit of claim 12, wherein the first and second metallic elements are coupled to a ground.

14. The integrated circuit of claim 13, wherein the first and second metallic elements are strips of metallic material.

15. The integrated circuit of claim 14, wherein of the first and second metallic elements each extends outwardly from a center area of the doped region.

16. A method comprising:
providing a substrate;
forming a doped region within the substrate;
forming metallic contacts within the substrate on the doped region;
forming metallic elements on the metallic contacts;
forming an oxide layer to separate the metallic elements from each other; and
forming a capacitor comprising:
   depositing a first metallic layer over the metallic elements; and
   depositing a second metallic layer over the first metallic layer.

17. The method of claim 16, wherein each of the metallic elements is formed by depositing a metallic precursor layer on the metallic contacts and selectively removing portions of the metallic precursor layer.

18. The method of claim 16, wherein the metallic elements are formed as metallic strips that extend outwardly from a center area of the doped region.

19. A method of making an integrated circuit package having a substrate and a doped region within the substrate, the method comprising:
forming metallic contacts within the substrate and on the doped region;
forming metallic elements on the metallic contacts;
forming an oxide layer to separate the metallic elements from each other; and
forming a capacitor comprising:
   depositing a first metallic layer over the metallic elements; and
   depositing a second metallic layer over the first metallic layer.

20. The method of claim 19, wherein each of the metallic elements is formed by depositing a metallic precursor layer on the metallic contacts and selectively removing portions of the metallic precursor layer.

\* \* \* \* \*